(12) United States Patent
Cai et al.

(10) Patent No.: US 6,536,001 B1
(45) Date of Patent: Mar. 18, 2003

(54) CIRCUIT AND METHOD FOR CONVOLUTIONAL INTERLEAVING USING A SINGLE MODULO OPERATION

(75) Inventors: Lujing Cai, Tinton Falls, NJ (US); Wenwei Pan, Ocean, NJ (US); Jian Wang, Morganville, NJ (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 09/524,464

(22) Filed: Mar. 13, 2000

Related U.S. Application Data

(60) Provisional application No. 60/123,876, filed on Mar. 11, 1999.

(51) Int. Cl.[7] .............................................. H03M 13/27
(52) U.S. Cl. ...................................................... 714/701
(58) Field of Search ................................. 714/701, 702

(56) References Cited

U.S. PATENT DOCUMENTS

| | | | | |
|---|---|---|---|---|
| 5,042,033 A | * | 8/1991 | Costa ........................... 714/701 |
| 5,572,532 A | * | 11/1996 | Fimoff et al. ................ 714/702 |
| 5,636,224 A | * | 6/1997 | Voith et al. .................. 711/154 |
| 5,737,337 A | * | 4/1998 | Voith et al. .................. 714/702 |
| 5,745,497 A | * | 4/1998 | Ben-Efraim et al. ......... 714/702 |
| 5,764,649 A | * | 6/1998 | Tong ............................ 714/701 |
| 5,883,907 A | * | 3/1999 | Hoekstra ...................... 714/784 |
| 5,912,898 A | * | 6/1999 | Khoury ........................ 714/701 |
| 5,928,371 A | * | 7/1999 | Robinson, Jr. et al. ...... 714/702 |
| 5,978,883 A | * | 11/1999 | Hanna ............................ 711/5 |
| 5,991,857 A | * | 11/1999 | Koetje et al. ................ 711/157 |
| 6,014,761 A | * | 1/2000 | Lachish et al. ............. 714/702 |
| 6,035,427 A | * | 3/2000 | Kweon ........................ 711/200 |
| 6,138,262 A | * | 10/2000 | Baek ............................ 714/768 |
| 6,151,690 A | * | 11/2000 | Peeters ........................ 711/157 |
| 6,178,530 B1 | * | 1/2001 | Aman et al. ................. 711/157 |
| 6,192,493 B1 | * | 2/2001 | Combelles et al. .......... 714/701 |
| 6,202,178 B1 | * | 3/2001 | Spruyt ......................... 714/702 |
| 6,314,534 B1 | * | 11/2001 | Agrawal et al. ............. 714/702 |
| 6,353,900 B1 | * | 3/2002 | Sindhushayana et al. ... 714/701 |
| 6,370,670 B1 | * | 4/2002 | Le Dantec et al. .......... 714/781 |

* cited by examiner

*Primary Examiner*—Stephen M. Baker
(74) *Attorney, Agent, or Firm*—Thomas, Kayden, Horstemeyer & Risley

(57) ABSTRACT

A circuit and method that provides a one-step real time pointer for interleaving/deinterleaving that uses a single modulo operation is disclosed. The single modulo pointer of the present invention may be used to increase data throughput through a data interleaver/deinterleaver. A memory address pointer consistent with the present invention may be implemented with a multiplexer, an adder, a counter, and a modulo operator. A method for convolutional interleaving/deinterleaving is also disclosed.

11 Claims, 11 Drawing Sheets

CIRCUIT AND METHOD FOR CONVOLUTIONAL INTERLEAVING USING A SINGLE MODULO OPERATION

CROSS-REFERENCE TO RELATED APPLICATIONS

The present application claims the benefit of U.S. provisional patent application, serial No. 60/123,876, filed Mar. 11, 1999, entitled, "Method and Apparatus for Convolutional Interleaving/Deinterleaving Using Single Modulo Operation," which is hereby incorporated by reference in its entirety. This application is further related to U.S utility patent application entitled, "System and Method for Resource Optimized Integrated Forward Error Correction in a DMT Communication System," and accorded Ser. No. 09/523,747, which is entirely incorporated herein by reference.

BACKGROUND OF THE INVENTION

1. Field of the Invention

The present invention generally relates to high speed data communications wherein signal information is processed both in digital and analog forms. More specifically, the invention is related to both a system and method that uses a single modulo operation to achieve maximum system performance in the form of data throughput in digital subscriber line modems that use convolutional interleaving to buffer the effects of burst errors in the data transmission channel.

2. Discussion of the Related Art

In recent years, telephone communication systems have expanded from traditional plain old telephone system (POTS) communications to include high-speed data communications as well. As is known, POTS communications include the transmission of voice information, control signals, public switched telephone network (PSTN) information, as well as, information from ancillary equipment in analog form (i.e. computer modems and facsimile machines) that is transmitted in the POTS bandwidth.

Prompted largely by the desire of large businesses to reliably transfer information over a broadband network, telecommunications service providers have employed digital subscriber lines (DSL) to provide a plethora of interactive multi-media digital signals over the same existing POTS twisted-pair lines.

The provision of DSL services to customer premises has proliferated over recent years. DSL services are typically provided to remotely located customer premises by equipping both the appropriate central office and the customer premises with compatible DSL modems. DSL modems communicate by modulating a baseband signal with customer desired service signals, converting the modulated digital data signal to an analog signal, and transmitting the analog signal over the conventional copper wire pair provided in the PSTN from a central office to a customer premises via a carrier service area (CSA) loop. Well known data modulation and transmission techniques include mapping digital data to be transmitted into a multi-dimensional multi-level signal space constellation and decoding the received constellation to recover the transmitted information.

DSL modems use a number of different modulation schemes and rates. Asymmetric digital subscriber line (ADSL) systems adopted discrete multi-tone (DMT), a rate adaptive and tone flexible multi-carrier data transmission method. DMT systems, by nature of their distribution across multiple frequency bands, are capable of retuning modems to optimize data transfer for changing line conditions. DMT devices selectively transfer bits from the data stream in those discrete frequency bands that are uncorrupted from amplitude modulation radio interference and unaffected by phone system bridge taps, thereby tuning, or maximizing performance under changing line conditions.

To accommodate maximum flexibility for providers and end users of ADSL services, forward error correction (FEC) is selectively applied to the composite data streams to, or from, the central office ADSL modem. This permits FEC to be included or excluded on a data service by data service basis within the composite data stream.

As an example of the mixed requirements for FEC in an ADSL service, consider transmitting a one-way data stream from the central office to a remote unit along with a bi-directional channel. The end user may require high reliability on the one-way channel because the channel may contain highly compressed digital data with no possibility for requesting retransmission. For this portion of the composite data stream, FEC is necessary. On the other hand, voice services and duplex data services with their own embedded protocols may require minimum latency. For this portion of the composite data stream, FEC is optional.

FEC involves the addition of redundant information to the data to be transferred. The data to be transferred along with the redundant data when added together form what are commonly known as codewords. FEC in ADSL employs Reed-Solomon codes based on symbols of 8 bits to a byte. That is, a code over the Galois Field ($2^8$). FEC in ADSL is rate adaptable providing for various interleave depths and codeword lengths to support a range of data rates while maintaining constant interleave latency. An enhancement to FEC involves shuffling or interleaving the encoded data prior to transmission, then unshuffling or deinterleaving the data received at the remote DSL modem. Interleaving ensures that bursts of error noise during data transmission do not adversely affect any individual codeword in the transmission. If noise affects a particular frame of data, only a minimum number of bytes of any particular codeword will be affected as the individual codewords are distributed across multiple frames.

The combination of Reed-Solomon encoding with data interleaving is highly effective at correcting errors caused by impulse noise in the service subscriber's local loop. In convolutional interleaving, after writing a byte into interleave memory, a previously written byte is typically read from the same memory.

Standard T1.413, Interface between Networks and Customer Installation—ADSL Metallic Interface provides for convolutional interleaving/deinterleaving along with Reed-Solomon coding as part of forward error correction (FEC). The standard provides an effective method for dealing with burst error channels in modern telecommunication systems. In DMT systems, two latency channels are supported: interleave data and fast data (without interleaving). Convolutional interleaving/deinterleaving is typically implemented by processing the Reed-Solomon encoded digital data sequence through a linear finite state shift register. In high bit rate applications like DMT, a random access memory (RAM) device may be used as the data storage means. Convolutional interleaving/deinterleaving is computation intensive. In software approaches that use a single address pointer and several modulo and addition operations to update the address pointer, system level concurrency and performance is adversely affected. Conversely, hardware approaches that utilize multiple pointers for interleaving/deinterleaving operations increase the complexity of the overall DSL system. The system performance trade-off introduced by FEC in the form of Reed-Solomon coding and convolutional interleaving can be described as increased data transmission reliability at the expense of increased channel latency. U.S. Pat. No. 5,764,649 to Tong introduced a method for efficient address generation for convolutional interleaving. The method taught in the '649 patent is a multi-step computation intensive process for minimizing the amount of memory required. The '649 patent requires many cycles and instructions to read and write interleaved data. As a result, data transmission is delayed for convolutional data interleaving.

SUMMARY OF THE INVENTION

In light of the foregoing, the invention is a circuit and method that provides a one-step real time pointer for interleaving/deinterleaving that uses a single modulo operation. The single modulo pointer of the present invention may be used to increase data throughput through an interleaver/deinterleaver.

To achieve the objects and advantages of the present invention, the present invention is directed to a circuit and method for implementing an addressing pointer that permits the integration of both fast path and interleaved data in a memory device at the rate encoded data is provided. Similarly, the stored fast path and interleaved data may then be read from the memory device at the rate requested by the next data processing device, i.e., tone ordering and symbol generator, by using a similarly configured addressing pointer. The circuit and method of the present invention is applicable in the receive data path as well. Received data symbols are processed by a demapper before being sent to deinterleave memory. As in the transmit data path, data from the demapper is applied to deinterleave memory at the rate provided by the demapper. The integrated fast path and interleaved data is read and forwarded to a Reed-Solomon decoder in one-step at the rate the data is requested by the Reed-Solomon decoder.

A RAM address pointer consistent with the present invention may be implemented with a multiplexer, an adder, a counter, and a modulo operator.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENTS

Figure 1:
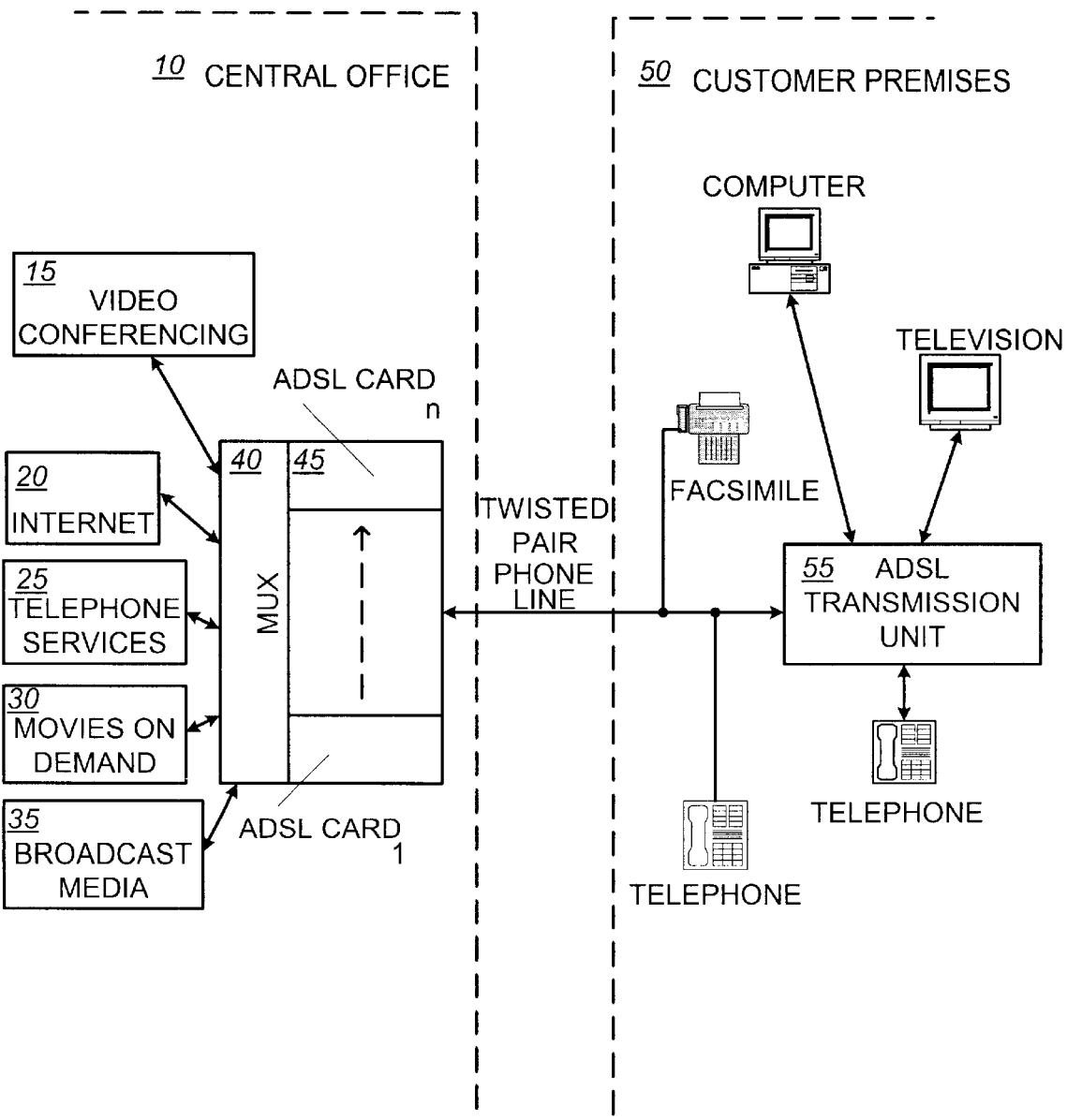
FIG. 1 is a block diagram illustrating the delivery of multiple broadband services via an ADSL communications system.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims. Turning now to the drawings, wherein like referenced numerals designate corresponding parts throughout the drawings, reference is made to FIG. 1, which illustrates the delivery of broadband communication services via an ADSL communications system over the POTS network. In this regard, a central office 10 is configured to receive broadband services which it assembles via central office ADSL card 45 for transmission over a POTS twisted-pair phone line to a customer premises 50. Examples of such broadband services are depicted as video conferencing 15, Internet 20, telephone services 25, movies on demand 30, and broadcast media 35. Central office 10 assembles signals from the aforementioned broadband services via multiplexer (mux) 40 for appropriate transformation and transmission by ADSL cards 45.

Customer premises 50 has a compatible ADSL transmission unit 55, which processes and distributes the several services to appropriate destination devices such as a computer, television, a facsimile machine, and a telephone as illustrated. It is significant to note that customer premises 50 may have POTS devices such as a facsimile machine and another telephone integrated on the PSTN line along with ADSL transmission unit 55. It should be understood that the circuitry conventionally implemented in, for example, an ADSL transceiver will be included within ADSL cards 45 and ADSL transmission unit 55 as shown in FIG. 1. The implementation of such circuitry will be appreciated by persons skilled in the art, and need not be described herein.

Figure 2:
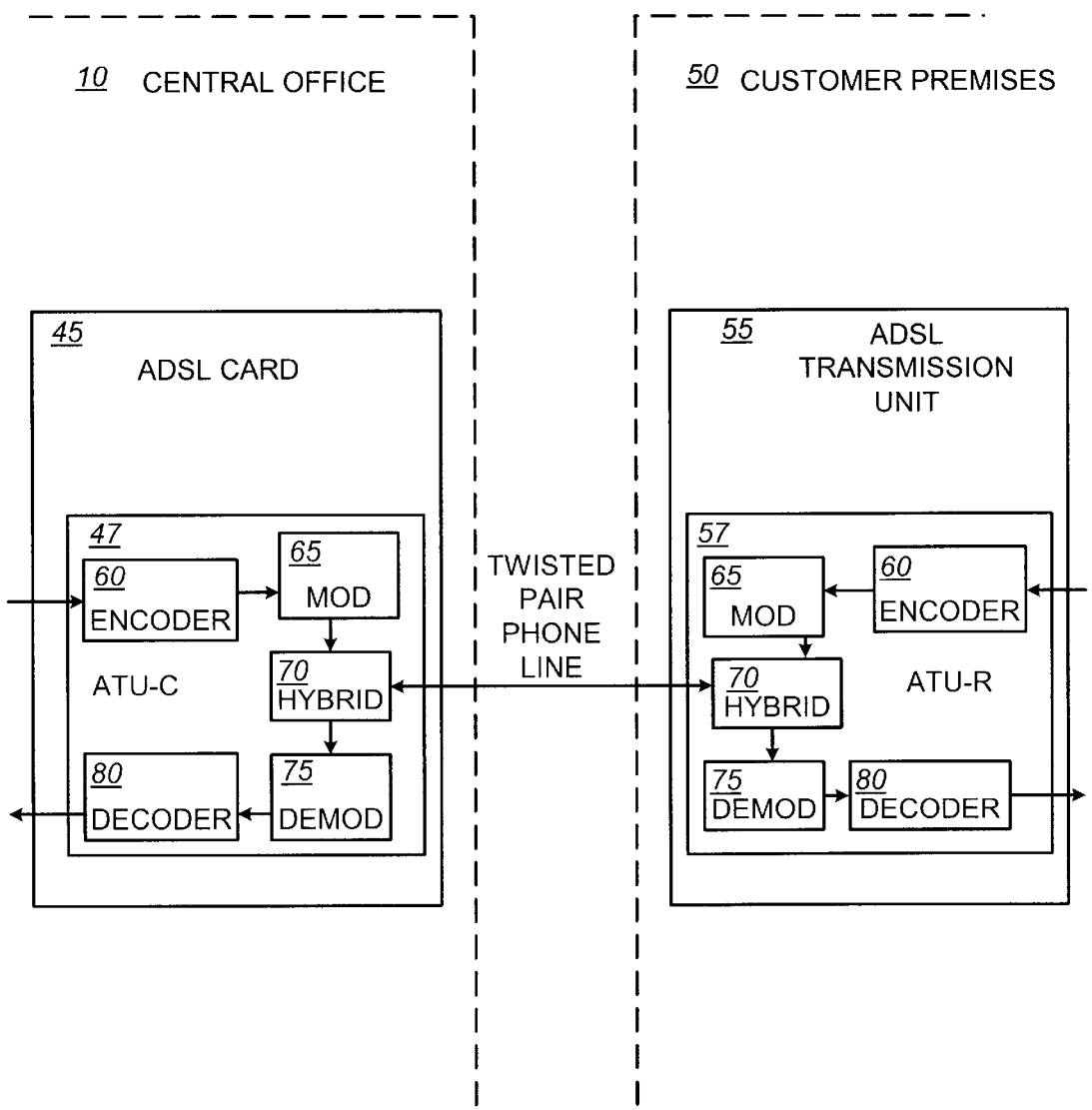
FIG. 2 is a block diagram further illustrating the functions performed within compatibly configured ADSL transmission units at a central office and a remote location consistent with the communications system of FIG. 1.

Having provided a top level description of a communications system configured to deliver a multitude of broadband services, reference is now made to FIG. 2, which illustrates a portion of a ADSL modem card 45 and an ADSL transmission unit 55 as shown in FIG. 1. In this regard, ADSL modem card 45 contains an ADSL modem unit—central office, hereinafter ATU-C 47. Similarly, ADSL transmission unit 55 contains an ADSL transmission unit-remote, hereinafter ATU-R 57. Both ATU-C 47 and ATU-R 57 serve to enable two-way communications between ADSL modem card 45 and ADSL transmission unit 55 via the PSTN. Since each ATU is similarly configured, the description herein will address the five functional blocks only once. Both ATU-C 47 and ATU-R 57 receive digital data in encoder 60. Encoder 60 processes the digital data and forwards it to modulator 65, which adaptively applies the digital data across the DMT frequencies. Modulator 65 then forwards a multitude of designated spread spectrum frequencies to hybrid 70 for data transmission along the PSTN line. In the manner described above, data is assembled, adaptively applied, and transmitted from one ADSL device to another across each of the separate DMT channels as the physical characteristics of the environment surrounding each individual system allows.

Similarly, hybrid 70 is configured to receive a multitude of spread spectrum frequencies from the remote ADSL transmission unit along the PSTN line. Hybrid 70 forwards designated spread spectrum frequencies to demodulator 75. Demodulator 75 processes the set of spread spectrum frequencies to recover digital data. Demodulator 75 forwards the digital data to decoder 80. Decoder 80 processes the digital data and distributes it to the appropriate broadband device.

Figure 3:
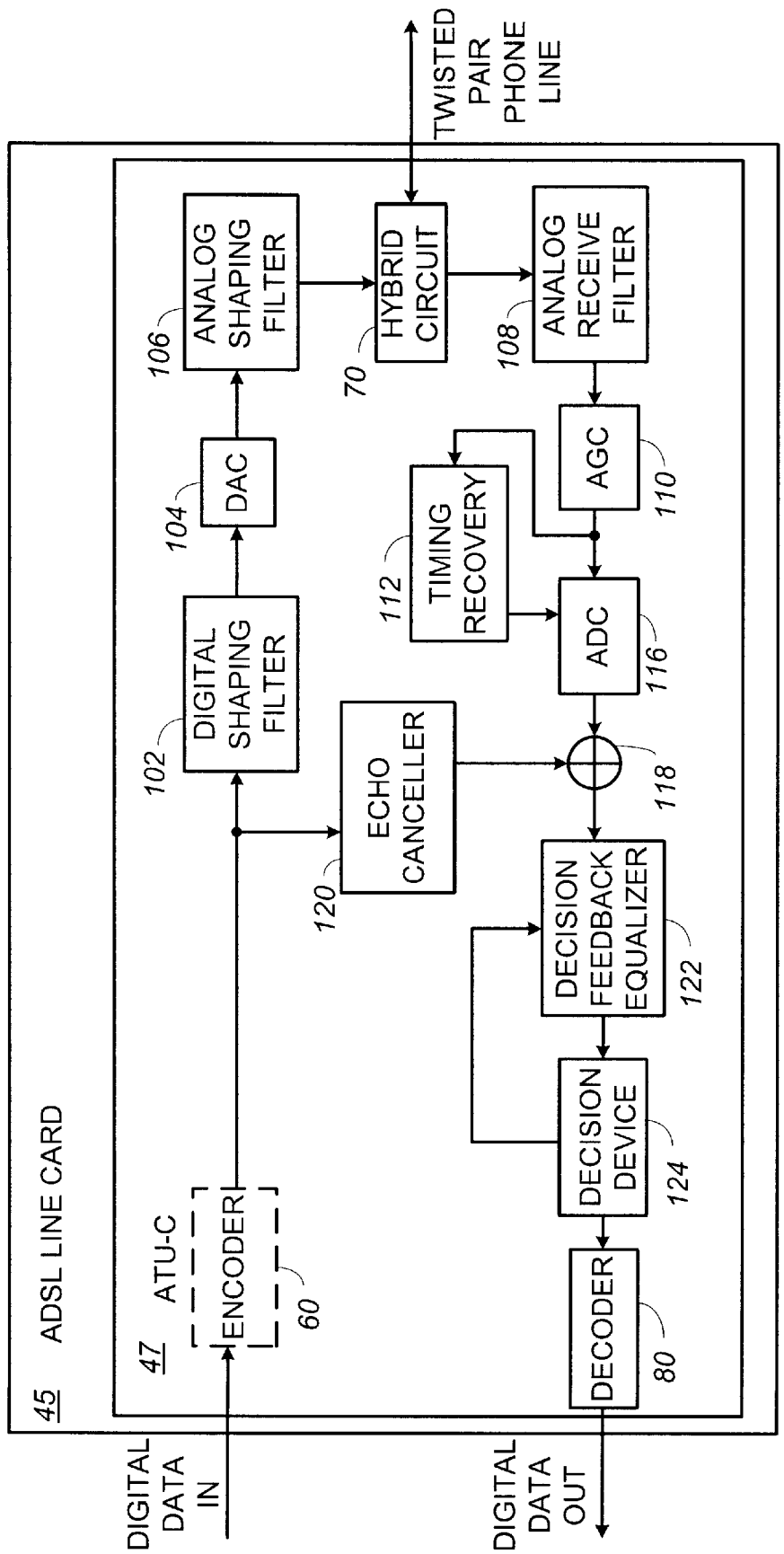
FIG. 3 is a block diagram that illustrates the functional elements of an ADSL transmission unit introduced in FIGS. 1 and 2.

Having provided a top level description of the functional blocks of an ADSL communications system configured to deliver a multitude of broadband services, with regard to FIG. 2, reference is now directed to FIG. 3, which illustrates a portion of an ADSL line card 45 and an ATU-C 47 as illustrated in FIG. 2. As shown in FIG. 3, an ATU-C 47 may be disposed within an ADSL line card 45 of FIG. 2 at either station in a two-station communication system. As further illustrated in FIG. 3, the ADSL line card 45 may be described as an ATU-C 47. As shown in FIG. 3, an ATU-C 47 may comprise an encoder 60, a digital shaping filter 102, a digital to analog converter (DAC) 104, an analog shaping filter 106, and a hybrid circuit 70 in the upstream data path. Conversely, the ATU-C 47 may comprise a hybrid circuit 70, an analog receive filter 108, an automatic gain control amplifier (AGC) 110, a timing recovery circuit 112, an analog to digital converter (ADC) 116, a summer 118, an echo canceller 120, a decision feedback equalizer 122, a decision device 124, and a decoder 80 in the downstream data path.

In this regard, the upstream data transmission portion of an ATU-C 47 may function as follows. The bits of the digital data input signal may be encoded into a complex data symbol in encoder 60. The complex data symbols may be forwarded to a digital shaping filter 102 and an echo canceller 120. Digital shaping filter 102 may take the form of a finite impulse response (FIR) filter selected and used to shape the frequency spectrum across a particular ADSL communication channel. The output of the digital shaping filter 102 may then be forwarded to DAC 104. Having converted the digitally filtered complex data symbols representing the digital input data stream in DAC 104 to an analog signal, the analog representation of the digital data input stream may be further processed by an analog shaping filter 106. In this regard, analog shaping filter 106 may take the form of a Butterworth lowpass filter to control out-of-band energy present in the analog signal. The filtered transmit signal may then be coupled to the twisted pair telephone line via hybrid circuit 70. Hybrid circuit 70 may comprise two unidirectional ports (one for data transmission and one for data reception) and one bi-directional port. The bi-directional port may be integrated with the twisted-pair telephone line. If the impedance of the twisted-pair matches the design impedance of the hybrid, there will be perfect isolation between the transmitting and receiving ports within hybrid circuit 70. For this ideal case, the hybrid circuit 70 return loss is infinity. In reality, the line impedance is a variable of frequency and varies significantly between individual CSA loops.

Having briefly described the upstream functional operation of ATU-C 47, reference will now be directed to downstream data transmission within ATU-C 47. In this regard, a Butterworth low-pass filter may also be used for the analog receive filter 108. The function of the analog receive filter 108, like its counterpart in the transmission path of ATU-C 47 is to reduce out-of-band noise. Having removed the low-frequency out-of-band noise in the analog receive filter 108, the filtered analog data stream may be forwarded to the AGC 110. AGC 110 may be necessary to bring the received signal magnitude to that close to the normal transmit signal level for subsequent digital conversion and processing. Having adjusted the magnitude of the received signal in AGC 110, the filtered and amplified receive signal may be processed through a timing recovery circuit 112. Timing recovery circuit 112 typically coordinates the sampling clocks used to process data in both DAC 104 in the upstream data path, as well as, ADC 116 in the receive data path. ADC 116 may be synchronized to the DAC 104 through the timing recovery circuit 112 such that upstream and downstream data symbols are synchronized within the ATU-C 47.

Once the received data has been converted to a digital data stream in ADC 116, digital signal processing of the complex data symbols encoded within the received signal path may be processed. After analog to digital conversion, the output of the echo canceller 120 from the upstream data path may be mathematically combined with the received signal. The combination may take place in summer 118.

Echo canceller 120 may be designed to resemble the equivalence of the echo path as defined by both the digital and analog shaping filters 102, 106, the DAC 104, the hybrid circuit 70, the analog receive filter 108, the AGC 110, the timing recovery circuit 112, and the ADC 116. In typical configurations, the echo path transfer function is identified with an adaptive signal processing algorithm.

The digitized and echo-canceled received signal may be further filtered by decision feedback equalizer 122 before being forwarded to a decision device 124. The decision feedback equalizer 122 may comprise a feed-forward filter and a feedback filter. The feed-forward filter equalizes the precursor of the CSA loop channel impulse response, while the feedback filter cancels the effect of the post-cursor of the channel impulse response. The decision feedback equalizer 122 is necessary for the ATU-C 47 to maintain minimal noise enhancement during the channel equalization process. Decision device 124 may take the form of a threshold detector configured to correspond to the discrete voltage levels used by the line code. After signal processing in the decision device 124, received symbols are converted back into signal bits in decoder 80 to create a digital data bit stream.

Forward Error Correction

Figure 4:
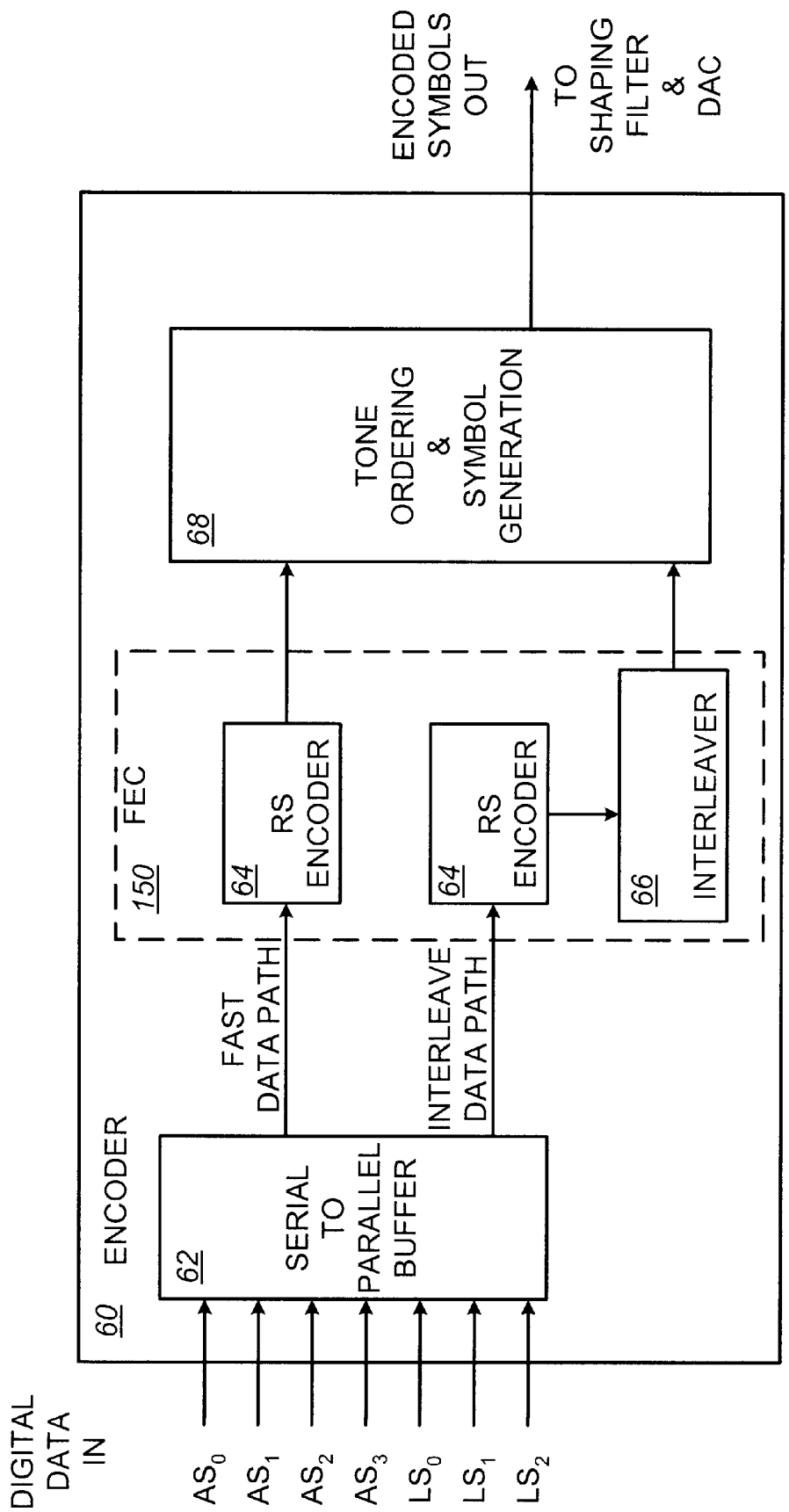
FIG. 4 is a functional block diagram illustrating a prior art FEC configuration.

Having described both the upstream and downstream processing paths through an ATU-C 47 with regard to FIG. 3, reference is now directed to FIG. 4. In this regard, FIG. 4 is a functional block diagram illustrating forward error correction (FEC) in the encoder 60 of FIGS. 2 and 3.

As illustrated in FIG. 4, an encoder 60 configured to perform FEC may comprise a serial to parallel buffer 62, a FEC 150, and a tone ordering and symbol generator 68. As further illustrated in FIG. 4, the FEC 150 may comprise one or more Reed-Solomon encoders 64 and an interleaver 66.

Digital data signals enter the encoder 60 on one or more possible input paths herein illustrated as AS0, AS1, AS2, AS3, LS0, LS1, LS2. AS stands for asymmetric signal and corresponds to downstream simplex data designated for transmission from the ATU-C 47 to the ATU-R 57. The data rates on each of the $AS_x$ channels are determined through rate negotiation. The LS channels are similar, except that they are bi-directional and typically operate at a lower transmission rate. Different $AS_x$ and $LS_x$ channels may correspond to different digital services. For example, $LS_x$ channels may be used for videophone, digital telephony, data transfer, and signaling. $AS_x$ channels are typically used for high-quality digital video, but are also appropriate for high-speed data transfer.

One of ADSL's features, rate negotiation, accommodates various applications within a single standard compliant modem. During initialization of the ADSL link, the ATU-C 47 transmits a set of data rates that it would prefer to use. The ATU-R 57 can implement these rates, or signal to the ATU-C 47 that it is unable to support the preferred rates. The number of bytes per symbol and selected coding options are exchanged during rate negotiation for each of the $AS_x$ and $LS_x$ channels.

Another feature of the separate data paths through the ATU-C 47 supports the fast/interleave data processing concept. As illustrated in FIG. 4, the $AS_x$ and $LS_x$ data channels may be processed by serial to parallel buffer 62 to create fast path data and interleave data for FEC processing in Reed-Solomon encoders 64 located within FEC 150. Data signals requiring low-latency transfer through the ADSL communication link may be assigned (through the rate negotiation function) to a fast data path with minimal latency. Data signals that can tolerate a longer processing delay may be assigned to an interleave path that has much better immunity to noise impulses. Data bits in the interleave path are time interleaved over a relatively long period of time to disperse the effect of data transmission errors introduced by temporary impulsive disturbances on the twisted-pair telephone line.

As further illustrated in FIG. 4, both the fast and interleaved data paths are independently applied to Reed-Solomon encoders 64 as shown in FEC 150. Reed-Solomon encoders 64 independently generate N symbol codewords comprising K data symbols of S bits each with N−K parity symbols of S bits each added thereto. The total number of parity symbols is equal to 2T, where 2T=N−K. The N symbol codewords are a systematic code because the encoded data is left unchanged and the parity symbols are appended. Reed-Solomon codes provide a significant advantage in that they can correct up to T symbol errors in the N symbol codeword. Given a symbol size S (the bit width per symbol), the maximum codeword length N for a Reed-Solomon code is $N=2^S-1$. Generally, the amount of processing power required to encode and decode Reed-Solomon codes is related to the number of parity symbols per N symbol codeword. A large value for T translates into the ability to correct a large number of errors in the received N symbol codeword, but correspondingly requires more computational power than if T were of a smaller magnitude.

A Reed-Solomon N symbol codeword is generated using a generator polynomial, where all valid codewords are exactly divisible by the generator polynomial. The form of the generator polynomial is given by $g(x)=(x-\alpha^i)(x-\alpha^{i+1}) \ldots (x-\alpha^{i+2t-1})$, and the N symbol codeword is generated using $c(x)=g(x)i(x)$, where $g(x)$ is the generator polynomial, $i(x)$ is the information or data block, and $c(x)$ is a valid N symbol codeword, and $\alpha$ is referred to as a primitive element of the field. The 2T parity symbols in the N symbol codeword are given by $p(x)=i(x)x^{N-K} \mod g(x)$.

As further illustrated in FIG. 4, the Reed-Solomon encoded fast path data and the Reed-Solomon encoded interleaved data may be then forwarded for further digital processing by tone ordering and symbol generator 68 prior to being further processed by the shaping filters 102 and 106 and DAC 104 prior to transmission via hybrid 70 (see FIG. 3).

Figure 5:
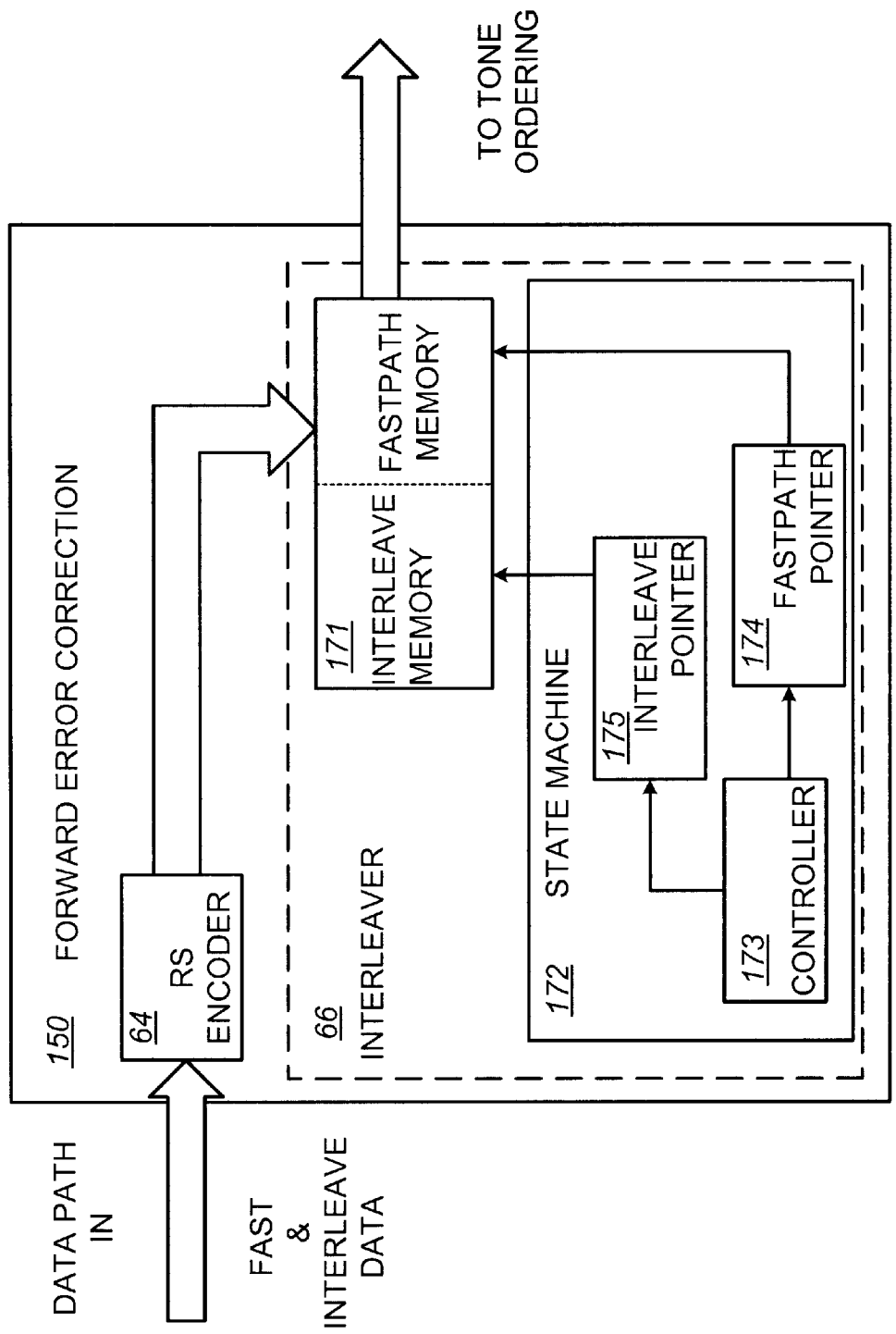
FIG. 5 is a block diagram illustrating the location of the pointer of the present invention in a state machine used to control data interleaving in the data transmission path.

Single Modulo Operation Pointer for Integrated Interleaving/Deinterleaving in Forward Error Correction Having described a typical prior art encoder 60 with regard to FIG. 4, reference is now directed to FIG. 5, which illustrates a forward error correction device 150 with an improved interleaver 66 that uses a single modulo operation pointer to maximize data throughput. In this regard, the improved FEC 150 may comprise a single Reed-Solomon encoder 64 and an interleaver 66. The interleaver 66 may further comprise an interleave memory 171 and a state machine 172. The interleave memory 171 may be divided into a portion for interleaved data storage and a portion for fastpath data storage as illustrated in FIG. 5. The interleave memory may be implemented via on chip RAM as well as with external RAM devices well known by those skilled in the art. The state machine 172 may further comprise controller 173, fastpath pointer 174, and interleave pointer 175.

In this regard, controller 173 coordinates operation of the interleave pointer 175 to ensure that data being written to interleave memory 171 by the Reed-Solomon encoder 64 is placed in a memory location where it can later be retrieved in the correct sequence for further digital processing. Similarly, controller 173 coordinates operation of the fastpath pointer 174 to ensure that fastpath data being stored in interleave memory 171 by the Reed-Solomon encoder 64 is placed in memory locations where they can later be retrieved in the proper sequence for further digital processing. It is readily apparent that if fast path and interleave data are integrated or written to a single memory device using a forward operative process that the fast path and interleave data may be reassembled or read in the correct order by a similar process configured to automatically recognize fast path and interleaved data locations within the memory device.

Both fast path data and interleave data may be introduced at the input to a single Reed-Solomon encoder 64 for encoding. As each data word is encoded, the encoded output data may be sent to interleave memory 171. State machine 172 may be configured to control the positioning of the fastpath pointer 174 and the interleave pointer 175 such that the fastpath memory address is properly located for each fastpath data write/read operation and such that the interleave memory address is properly located for each interleave data write/read operation. By processing both the fastpath data and interleave data, the integrated interleaver 66 of the present invention provides input processing rate adaptability as data may be stored by interleave memory 171 once it has been encoded by Reed-Solomon encoder 64. Similarly, since both the fast path and interleaved data are available in the same memory device (interleave memory 171) the interleaver 66 is rate adaptable to the next stage of digital signal processing, indicated in FIG. 5 as tone ordering. The tone ordering operation may control the rate that data is read from the interleave memory 171.

Figure 6:
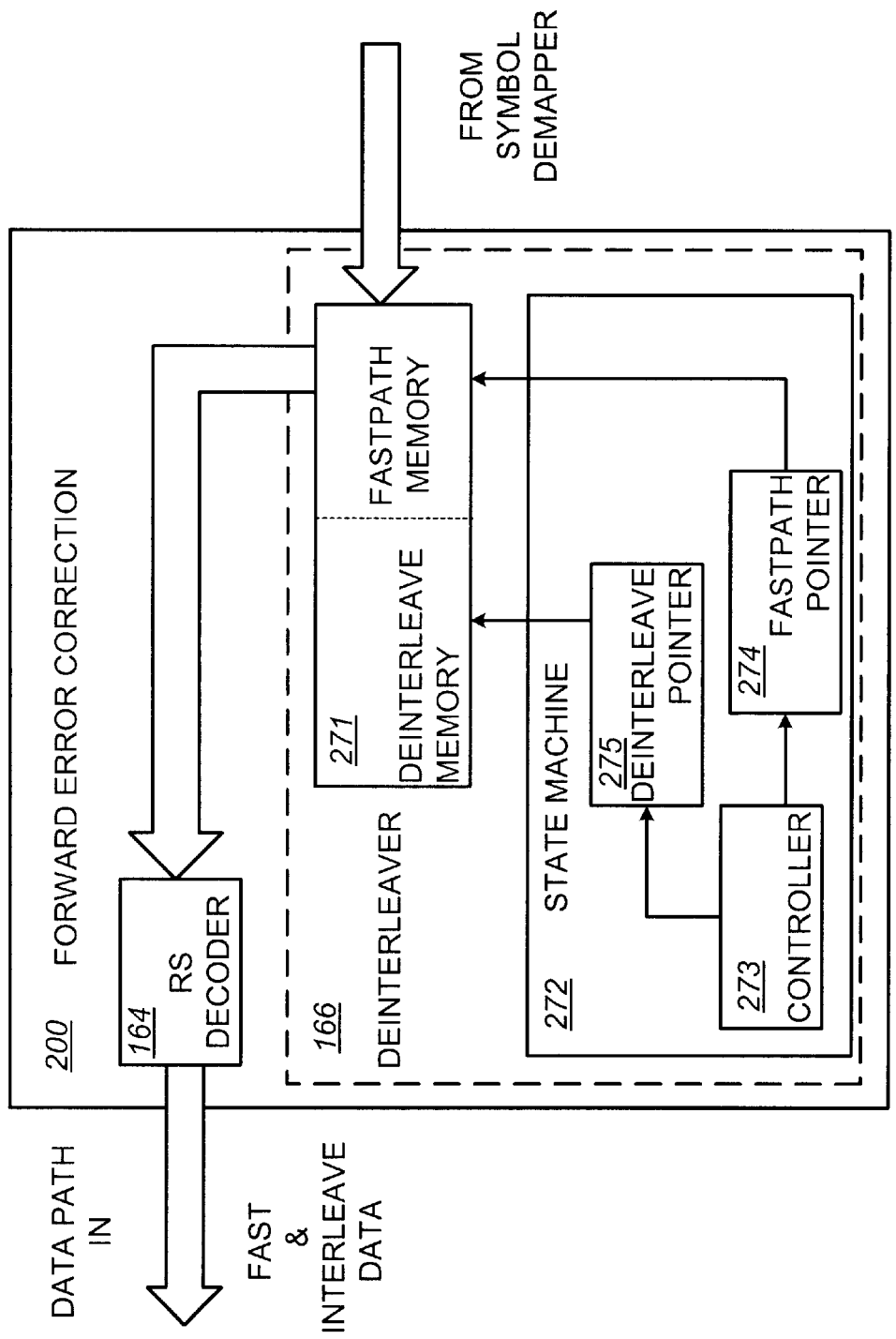
FIG. 6 is a block diagram illustrating the location of the pointer of the present invention in state machine used to control data deinterleaving in the receive data path.

Having briefly described the location of the fastpath and interleave pointers 174, 175 within the architecture of the improved FEC 150 in the transmit direction, reference is now directed to FIG. 6, which illustrates a functional block diagram featuring modem architecture in the receive data path.

In this regard, the improved FEC 200 may comprise a single Reed-Solomon decoder 164 and a deinterleaver 166. The deinterleaver 166 may further comprise a deinterleave memory 271 and a state machine 272. The deinterleave memory 271 may be divided into a portion for interleaved data storage and a portion for fastpath data storage as illustrated in FIG. 6. The deinterleave memory 271 may be implemented via on chip RAM as well as with external RAM devices well known by those skilled in the art. The state machine 272 may further comprise a controller 273, a fastpath pointer 274, and a deinterleave pointer 275.

In this regard, the controller 273 coordinates the deinterleave pointer 275 to ensure that data being placed in deinterleave memory 271 by a symbol demapper (not shown) is placed in a memory location where it can later be retrieved in the correct sequence for further digital processing. Similarly, controller 273 coordinates the fastpath pointer 274 to ensure that fastpath data being stored in deinterleave memory 271 by the symbol demapper (not shown) is placed in memory locations where it can later be retrieved in the proper sequence for further digital processing. It is readily apparent that if fast path and interleave data are integrated or written to a single memory device using a forward operative process that the fast path and interleave data may be reassembled or read in the correct order by a similar process configured to automatically recognize fast path and interleaved data locations within the memory device.

Both fast path data and interleave data having been previously processed by a symbol demapper may be introduced at the deinterleave memory 271 for interim storage and deinterleaving. As each data symbol is processed, the demapped data may be sent to deinterleave memory 271. State machine 272 may be configured to control the positioning of the fastpath pointer 274 and the interleave pointer 275. By processing both the fastpath data and deinterleave data, the integrated deinterleaver 166 of the present invention provides input processing rate adaptability as data may be stored by interleave memory 271 once it has been processed by the demapper. Similarly, since both the fast path and interleaved data are available in the same memory device (deinterleave memory 271) the deinterleaver 166 is rate adaptable to the next stage of digital signal processing, illustrated in FIG. 6 as Reed-Solomon decoding. In this regard, Reed-Solomon decoder 164 may control the rate that data is read from the deinterleave memory 271.

Figure 7:
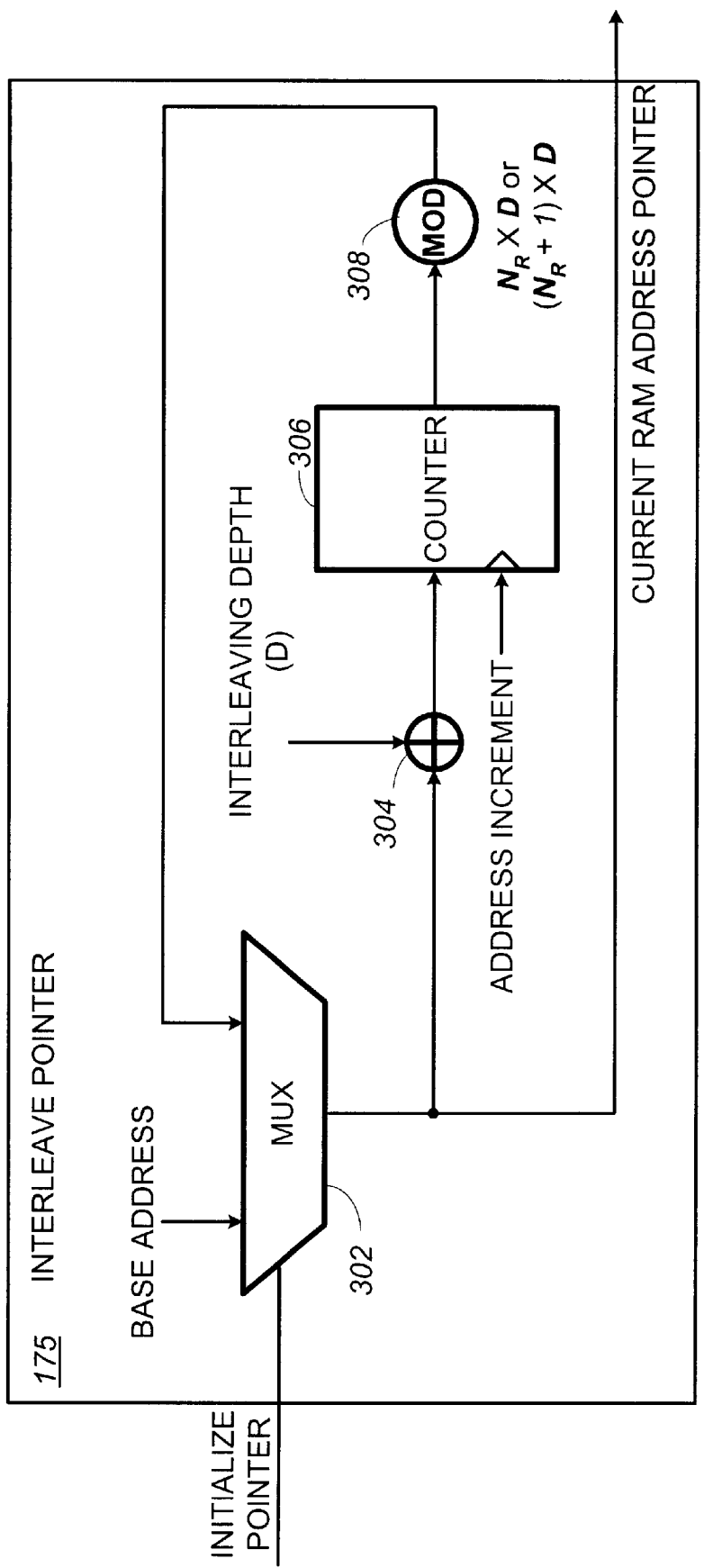
FIG. 7 is a functional block diagram illustrating a pointer consistent with the present invention.

Having briefly described the location of the fastpath and the interleave pointers 274, 275 within the architecture of the improved FEC 200 in the receive direction, reference is now directed to FIG. 7, which presents a functional block diagram of the interleave pointer 175 of FIG. 5.

In this regard, interleave pointer 175 may be implemented with a multiplexer (mux), an adder, a counter, and a modulo operator as illustrated in FIG. 7. The mux 302 may be a two input, one output device as shown. Mux 302 may be configured to receive an initialize control signal and a base address from controller 173 (see FIG. 5). The single output of mux 302 may then be forwarded along with the interleaving depth to adder 304. The combination of the mux 302 output signal and the interleaving depth may then be forwarded to counter 306. Counter 306 may be configured to receive an address increment control signal from controller 173 (see FIG. 5). The output of counter 306 may then be forwarded to modulo operator 308. As illustrated in FIG. 7, the mux 302 output signal may then be used as the current RAM address pointer.

Figure 8:
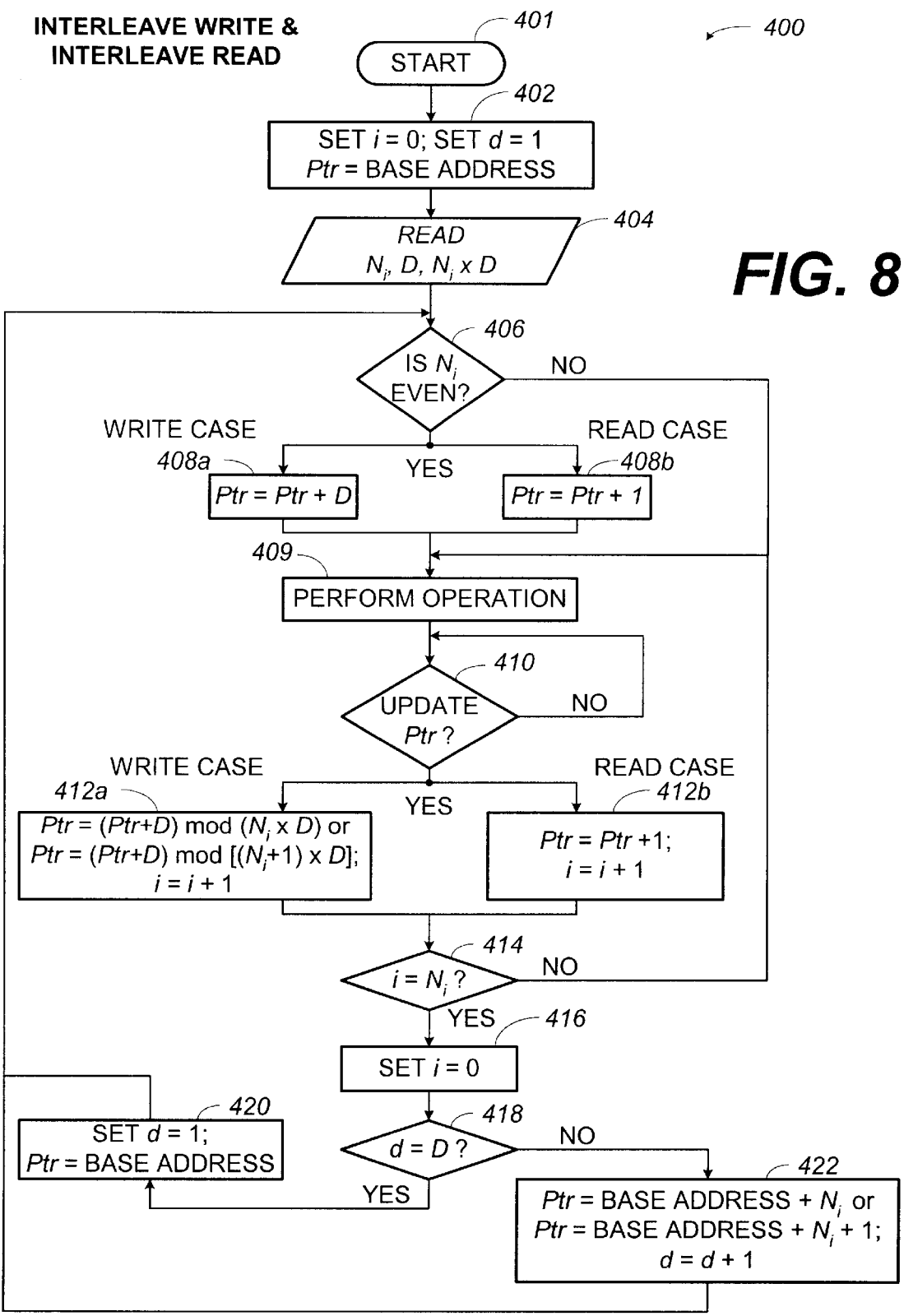
FIG. 8 is a flowchart illustrating operation of a pointer consistent with the present invention that operates to control memory addressing for interleaving data.

Having described the architecture of the interleave pointer 175 of FIG. 5 as further illustrated in FIG. 7, reference is now directed to FIG. 8. In this regard, FIG. 8 illustrates a flowchart depicting interleave pointer 175 control.

The interleave pointer control algorithm 400 of FIG. 8 begins with step 401, designated "start." Next, in step 402, the algorithm initializes a first counter, i, corresponding to interleave bytes, a second counter, d, for tracking interleaver progress up to the interleaver depth, and sets the pointer to a base address. Having initialized the counters and the pointer address in step 402, the algorithm proceeds to read system encoding variables $N_i$, the number of interleaved bytes in a codeword, D, the interleaver depth, and $N_i \times D$ in step 404. Since $N_i$ must be odd for convolutional interleaving, the algorithm performs step 406 where a check is performed to determine if $N_i$ is even. If yes, the interleaver pointer inserts a dummy byte by incrementing the base address location by the interleaver depth, D, in step 408. In the case where an interleave write operation is to be performed, the algorithm proceeds to step 408a, where the pointer is incremented by the interleaver depth, D. In the case where an interleave read operation is to be performed, the algorithm proceeds to step 408b, where the pointer is incremented by one. Having performed the appropriate write or read case adjustment in step 408a or 408b, the algorithm proceeds to perform an interleave write or an interleave read operation in step 409.

If the determination in step 406 is negative, that is $N_i$ is odd, the interleave pointer control algorithm 400 bypasses steps 408a and 408b and performs step 409 where the interleave memory write or interleave memory read operation may be performed. Next, in step 410, a determination is made if the next encoded data byte is available for processing. If no, the interleaver pointer control algorithm 400 may be configured to repeat step 410 until the next data byte is available. If the determination in step 410 is affirmative, that is the next data byte is available, the algorithm proceeds to perform step 412 where the pointer and the counter, i, are incremented.

As illustrated in FIG. 8, in the case where an interleave write operation is to be performed, the algorithm performs step 412a. As further illustrated in FIG. 8, step 412a may be configured to increment the pointer in an alternative manner. The first alternative may be used when $N_i$ is odd. The second alternative illustrated in step 412a may be applied when $N_i$ is even. In the case where an interleave read is to be performed, the algorithm performs step 412b.

Having performed the appropriate write or read pointer adjustment in step 412a or 412b, the algorithm proceeds to step 414, where the algorithm determines if the entire codeword has been interleaved. If the determination in step 414 is affirmative, the algorithm sets counter, i, to 0 in step 416. Otherwise, if the entire codeword has not been processed by the interleaver, the algorithm repeats steps 409 through 414 until the entire codeword has been processed by the interleaver.

Having processed a codeword and reset the codeword length counter, i, in step 416, the algorithm proceeds to compare counter, d, with the interleaver depth, D, in step 418. If it is determined in step 418 that counter, d, is equal to the interleaver depth, the algorithm proceeds to step 420, where d is set to 1 and the pointer is reset to the memory base address. If it is determined in step 418 that counter, d, is not equal to the interleaver depth, the pointer is adjusted as illustrated in step 422 and counter, d, is incremented by one.

As further illustrated in FIG. 8, step 422 may be configured to increment the pointer in an alternative manner. The first alternative may be used when $N_i$ is odd. The second alternative illustrated in step 412a may be applied when $N_i$ is even. Having performed step 420 or step 422 the algorithm returns to perform steps 406 through 422 for the remaining codewords.

Figure 9:
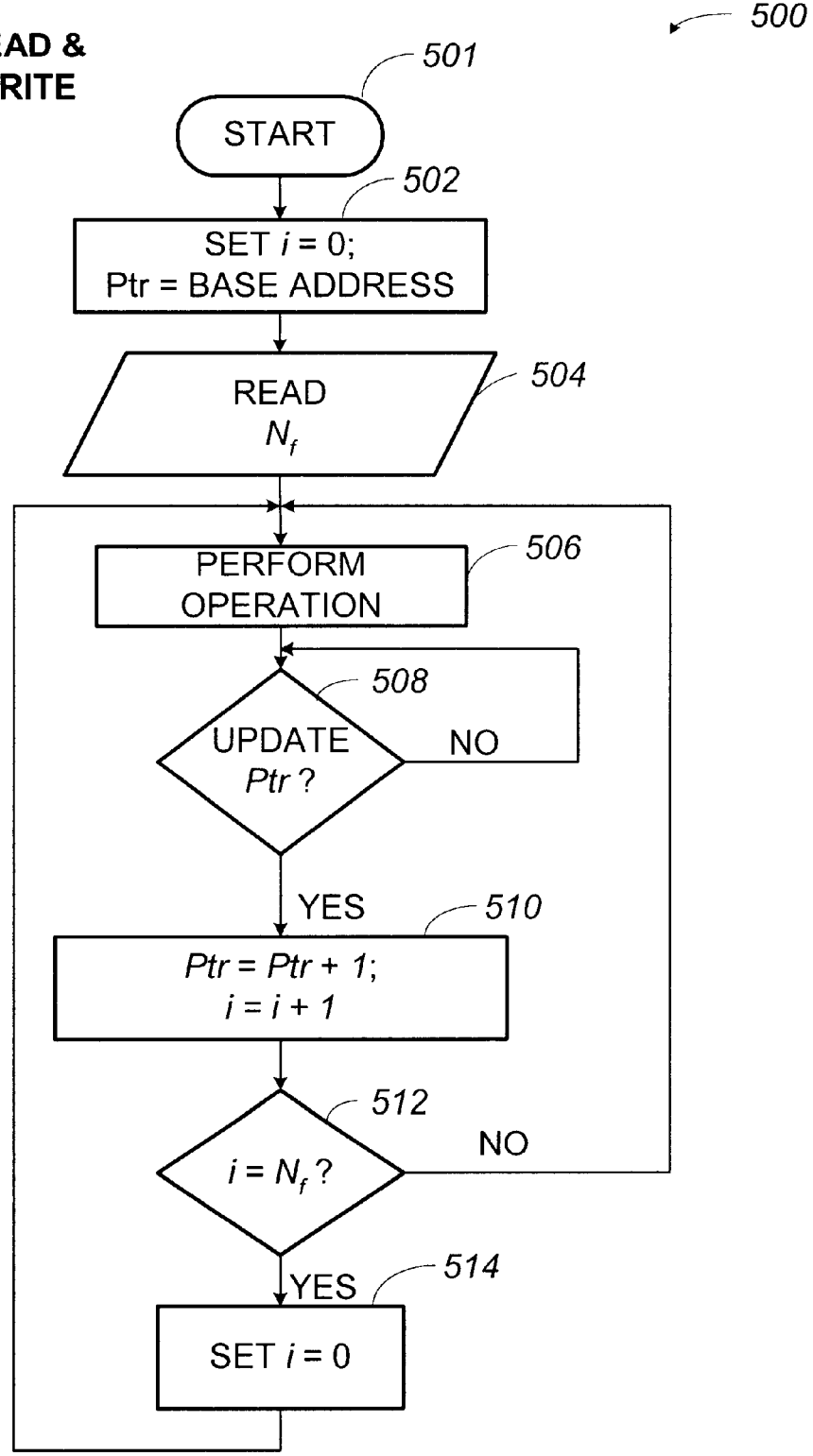
FIG. 9 is a flowchart illustrating operation of a pointer consistent with the present invention that operates to control memory addressing for fastpath data.

Having described operation of the interleave write and interleave read pointer with regard to the flowchart illustrated in FIG. 8, reference is now directed to FIG. 9. In this regard, FIG. 9 illustrates a flowchart that further describes operation of the fastpath read and fastpath write pointer introduced in FIG. 6.

The fastpath pointer control algorithm 500 of FIG. 9 begins with step 501, designated "start." Next, in step 502, the algorithm initializes a counter, i, and sets the pointer to a base address. Having initialized the counter and set the base address in step 502, the algorithm proceeds to read system encoding variable $N_f$, the number of fastpath bytes in a codeword in step 504. Next, the fastpath pointer control algorithm 500 performs step 506 where the fastpath memory write or fastpath memory read operation may be performed. In step 508, a determination is made if the next encoded data byte is available for processing. If no, the fastpath pointer control algorithm 500 may be configured to repeat step 508 until the next fastpath data byte is available. If the determination in step 508 is affirmative, that is, the next fastpath data byte is available, the algorithm proceeds to perform step 510 where the pointer and the counter, i, are incremented as shown. Next, in step 512, the algorithm determines if the entire fastpath codeword has been processed. If the determination in step 512 is affirmative, the algorithm sets counter, i, to 0 in step 514 and repeats steps 506 through 512 for the next fastpath data codeword. If the determination in step 512 is negative, the algorithm returns to step 506 where a fastpath write or fastpath read may be performed for the present fastpath data byte.

Figure 10A:
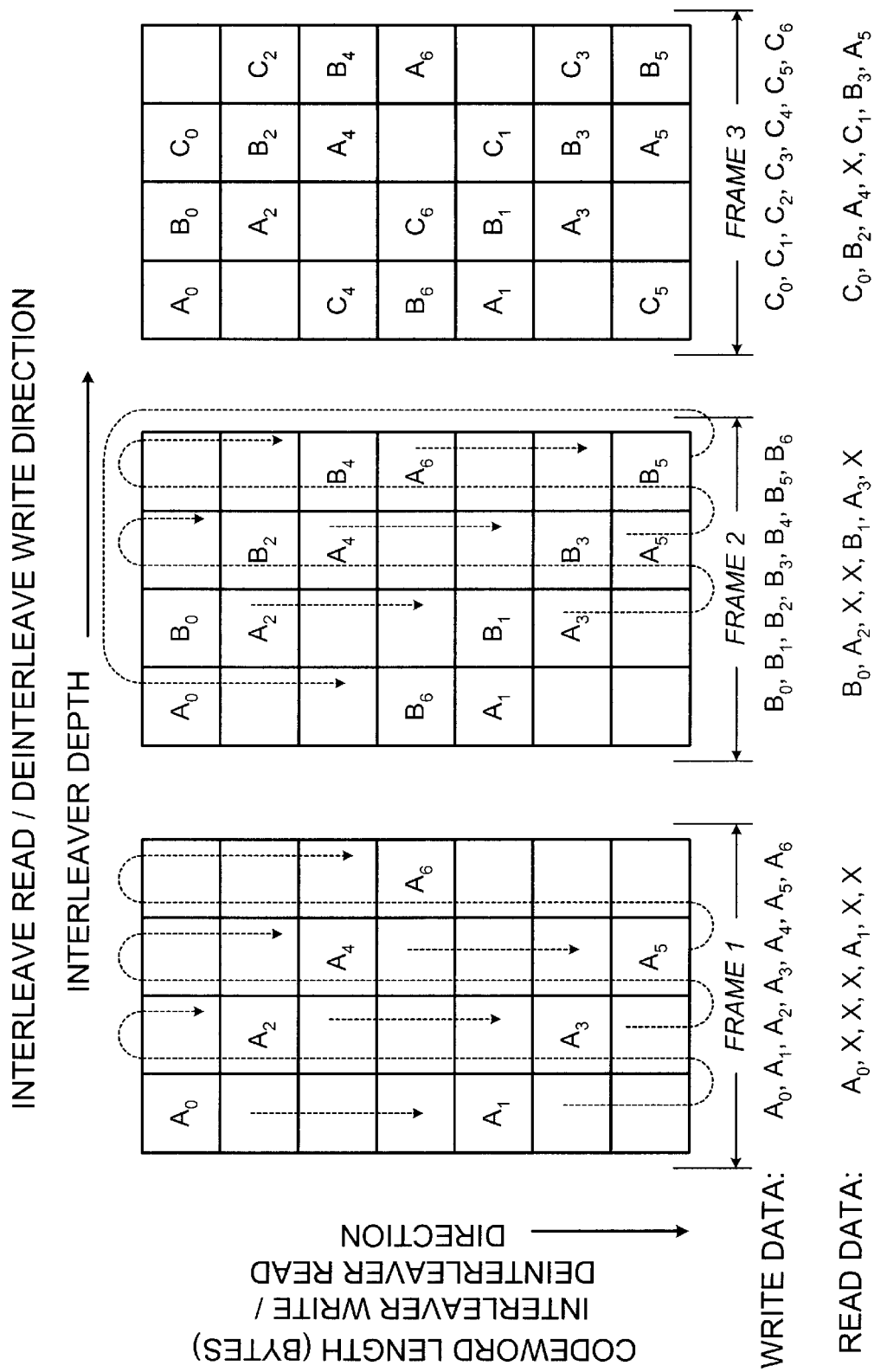
FIGS. 10A and 10B are diagrams further illustrating operation of a pointer consistent with the present invention by showing the sequence and placement of interleaved data bytes in the case where the interleaver depth is 4 and the codeword length is 7 bytes.
Figure 10B:
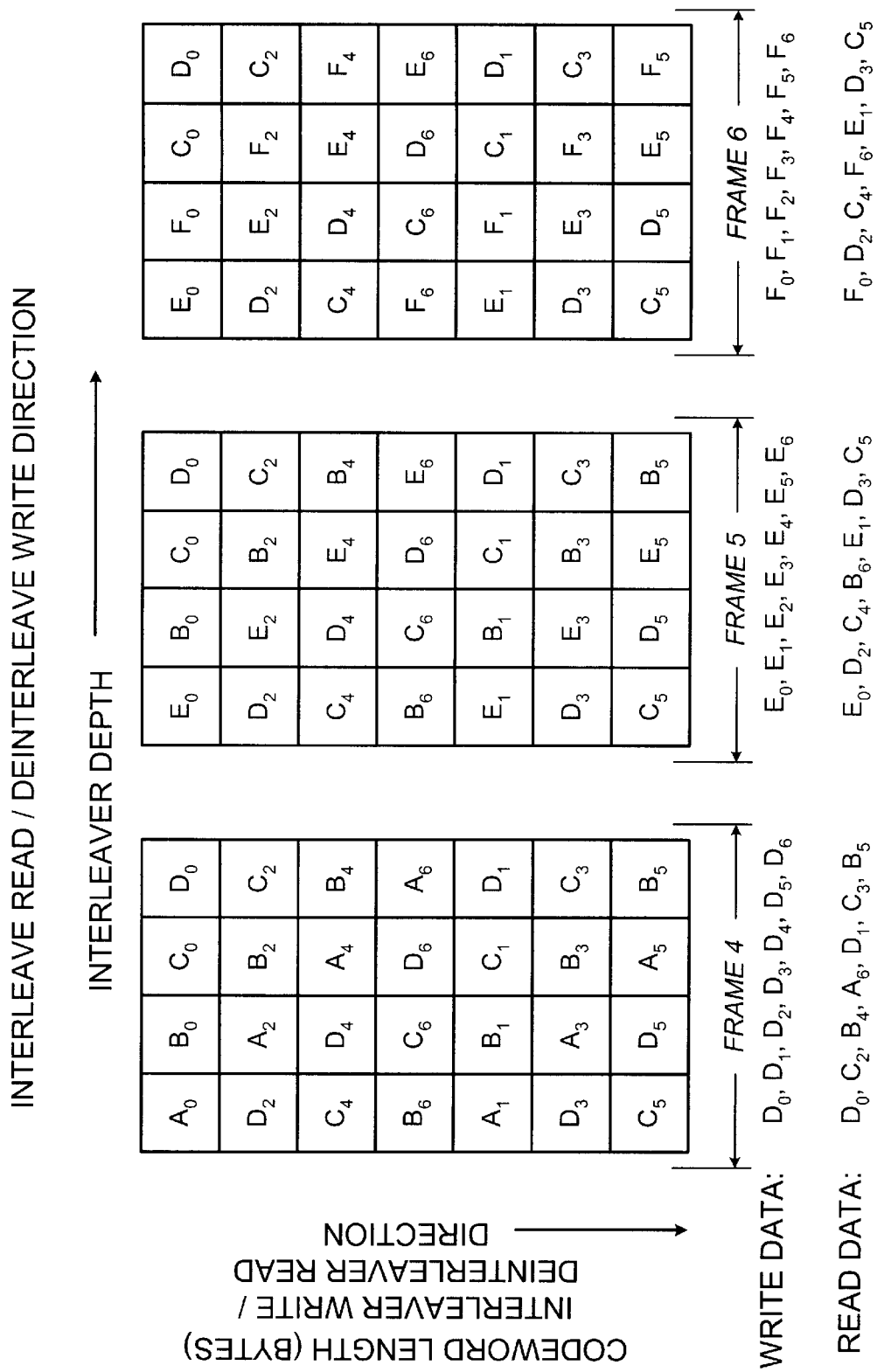

Having described the architecture of an interleave pointer in FIG. 7 and operation of both the interleave and fastpath memory address pointers in the flowcharts of FIGS. 8 and 9, reference is now directed to FIGS. 10A and 10B, which further illustrate data interleaving for the case where the interleaver depth is 4 bytes and the codeword length is 7 bytes.

In this regard, FIG. 10A illustrates the placement of write data bytes in the 4 by 7 array defined by the interleaver depth and the codeword length of the present example. As illustrated in frame 1 a first 7-byte codeword herein represented by bytes $A_0$ through $A_6$ may be interleaved (stored) into the 4 by 7 memory array as follows. The first byte, $A_0$ may be placed in a reference position defined by a base address. Thereafter, subsequent data bytes may be stored as shown in frame 1 every fourth location (the interleaver depth) from the previous byte. Once the first column locations have been expended, the interleave pointer may be configured to shift one column to the right as further illustrated in frame 1. It is significant to note that each of the frames 1 through 6 illustrated in FIGS. 10A and 10B are illustrated in a snapshot condition at the completion of the frame. As further illustrated in FIG. 10A, at the completion of frame 1, data bytes $A_0, A_1, A_2, A_3, A_4, A_5$, and $A_6$ are located in the memory array as shown. If the memory array was read at the completion of frame 1, the data read would comprise bytes $A_0$, X, X, X, $A_1$, X, X.

Having described the interleaving of a single symbol (7-byte codeword) after a first frame is processed, reference is now directed to frame 2 of FIG. 10A which illustrates the processing of a second symbol into the memory array.

As illustrated in frame 2 the second symbol herein represented by bytes $B_0$ through $B_6$ may be interleaved (stored) into the 4 by 7 memory array as follows. The first byte, $B_0$ may be placed in the memory position adjacent and to the right of the reference position as defined by a base address. Thereafter, subsequent data bytes may be stored as shown in frame 2 every fourth location from the previous byte. Once the second column locations have been expended, the interleave pointer may be configured to shift one column to the right as further illustrated in frame 2. Once columns 2 through 4 have been exhausted, the interleaver may be configured to return to the first column as illustrated in frame 2 of FIG. 10A. As further illustrated in FIG. 10A, at the completion of frame 2, data bytes $B_0, B_1, B_2, B_3, B_4, B_5$, and $B_6$ are located in the memory array as shown. If the memory array was read at the completion of frame 2, the data read would comprise bytes $B_0, A_2$, X, X, $B_1, A_3$, X. It is significant to note that the location of the 7-bytes of the first codeword are not affected as of the completion of frame 2.

Having described the interleaving of the first two symbols after a second frame is processed, reference is now directed to frame 3 of FIG. 10A which illustrates the processing of a third symbol into the memory array.

As illustrated in frame 3 the third symbol herein represented by bytes $C_0$ through $C_6$ may be interleaved (stored) into the 4 by 7 memory array as follows. The first byte, $C_0$ may be placed in the memory position two columns to the right of the reference position as defined by a base address. Thereafter, subsequent data bytes may be stored as shown in frame 3 every fourth location from the previous byte. Once the third column locations have been expended, the interleave pointer may be configured to shift one column to the right as previously illustrated with regards to frames 1 and 2. Again, once columns 3 and 4 have been exhausted the interleaver may be configured to return to the first column as previously shown. As further illustrated in FIG. 10A, at the completion of frame 3, data bytes $C_0, C_1, C_2, C_3, C_4, C_5$, and $C_6$ are located in the memory array as shown. If the memory array was read at the completion of frame 3, the data read would comprise bytes $C_0, B_2, A_4$, X, $C_1, B_3, A_5$. It is significant to note that the location of the 7-bytes of the first two codewords are not affected as of the completion of frame 3.

Having described the interleaving of the first three symbols after a third frame is processed, reference is now directed to frame 4 of FIG. 10B which illustrates the processing of a fourth symbol into the memory array.

As illustrated in frame 4 of FIG. 10B, the fourth symbol herein represented by bytes $D_0$ through $D_6$ may be interleaved (stored) into the 4 by 7 memory array as follows. The first byte, $D_0$ may be placed in the memory position three columns to the right of the reference position as defined by a base address. Thereafter, subsequent data bytes may be stored as shown in frame 4 every fourth location from the previous byte. Once the fourth column locations have been expended, the interleave pointer may be configured to shift back to the first column as previously illustrated with regards to frame 2. As further illustrated in FIG. 10B, at the completion of frame 4, data bytes $D_0, D_1, D_2, D_3, D_4, D_5$, and $D_6$ are located in the memory array as shown. If the memory array was read at the completion of frame 4, the data read would comprise bytes $D_0, C_2, B_4, A_6, D_1, C_3, B_5$. It is significant to note that the location of the 7-bytes of the first three codewords are not affected and that the memory array is full as of the completion of frame 4.

Having described the interleaving of the first four symbols after a fourth frame is processed, reference is now directed to frame 5 of FIG. 10B which illustrates the processing of a fifth symbol into the memory array.

As illustrated in frame 5 of FIG. 10B, the fifth symbol herein represented by bytes $E_0$ through $E_6$ may be interleaved (stored) into the 4 by 7 memory array as follows. The first byte, $E_0$ may be placed in the reference position as defined by a base address. Thereafter, subsequent data bytes may be stored as shown in frame 5 every fourth location from the previous byte. As illustrated in FIG. 10B, at the completion of frame 5, data bytes $E_0$, $E_1$, $E_2$, $E_3$, $E_4$, $E_5$, and $E_6$ are located in the memory array in those positions where the first codeword was located. If the memory array was read at the completion of frame 5, the data read would comprise bytes $E_0$, $D_2$, $C_4$, $B_6$, $E_1$, $D_3$, $C_5$. It is significant to note that after the completion of frame 5, the first codeword is no longer present in the memory array. The second and third codewords (previously stored) are not affected as of the completion of frame 5.

Having described the interleaving of the first five symbols after a fifth frame is processed, reference is now directed to frame 6 of FIG. 10B which illustrates the processing of a sixth symbol into the memory array.

As illustrated in frame 6 of FIG. 10B, the sixth symbol herein represented by bytes $F_0$ through $F_6$ may be interleaved (stored) into the 4 by 7 memory array as follows. The first byte, $F_0$ may be placed in the memory location adjacent and to the right of the reference position as defined by a base address. Thereafter, subsequent data bytes may be stored as shown in frame 6 every fourth location from the previous byte. As illustrated in FIG. 10B, at the completion of frame 6, data bytes $F_0$, $F_1$, $F_2$, $F_3$, $F_4$, $F_5$, and $F_6$ are located in the memory array in those positions where the second codeword was located. If the memory array was read at the completion of frame 6, the data read would comprise bytes $F_0$, $D_2$, $C_4$, $F_6$, $E_1$, $D_3$, $C_5$. It is significant to note that after the completion of frame 6, the first and second codewords are no longer present in the memory array. The third and fourth codewords (previously stored) are not affected as of the completion of frame 6.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. A rate adaptable memory address pointer for convolutional interleaving of codewords of varying byte lengths comprising:
    an interface configured to receive an interleaving depth signal, an address increment signal, a base address signal, a codeword length signal, and a pointer initialize signal;
    a multiplexer configured to receive the pointer initialize signal, the base address signal, and a second input signal, the multiplexer configured to select one of the base address signal and second input signal in response to the pointer initialize signal to create a multiplexer output signal;
    an adder configured to mathematically combine the multiplexer output signal and the interleaving depth signal to create a first counter input signal;
    a counter configured to receive the first counter input signal and an address increment signal, the counter configured to generate a counter output signal; and
    a modulo operator configured to receive the counter output signal and the codeword length signal to generate a memory address pointer control signal.

2. The pointer of claim 1, wherein the modulo operator is configured to perform a first operation when the codeword length signal indicates the number of bytes in the codeword is odd.

3. The pointer of claim 1, wherein the modulo operator is configured to perform a second operation when the codeword length signal indicates the number of bytes in the codeword is even.

4. A method for adaptive convolutional data interleaving comprising:
    initializing a first counter for counting the bytes of a word, the word having $N_i$ bytes;
    setting a base memory address;
    initializing a second counter for counting frames, wherein a frame is defined by the time it takes to process a word;
    applying the base address to a pointer, Ptr;
    determining an interleaver depth, D, and the product of $N_i$ and D;
    inserting a dummy byte when $N_i$ is even;
    otherwise performing an interleave write/read operation;
    updating the pointer and incrementing the first counter;
    determining if the entire word has been processed, if yes, reinitializing the first counter, if no, repeat the steps of performing an interleave write/read operation, updating the pointer, and determining if the entire word has been processed until the word is processed;
    comparing the second counter to the interleaver depth, if equal, set the second counter to 1 and apply the base address to the pointer, otherwise;
    incrementing the pointer and the second counter;
    repeating the steps of inserting, performing, updating, determining, and comparing until the second counter equals the interleaver depth.

5. The method of claim 4, wherein the step of inserting a dummy byte is accomplished by incrementing the write pointer by the interleaver depth when $N_i$ is even.

6. The method of claim 4, wherein the step of inserting a dummy byte is accomplished by incrementing the read pointer by one when $N_i$ is even.

7. The method of claim 4, wherein the step of incrementing the pointer is accomplished by setting the pointer to the sum of the base address and $N_i$ when $N_i$ is odd.

8. The method of claim 4, wherein the step of incrementing the pointer is accomplished by setting the pointer to the sum of the base address, $N_i$, and 1 when $N_i$ is even.

9. The method of claim 4, wherein the step of updating the pointer is accomplished by incrementing the pointer by 1 for an interleaver read operation.

10. The method of claim 4, wherein the step of updating the pointer is accomplished by setting the pointer to the result of a $(Ptr+D) \bmod (N_i \times D)$ operation when $N_i$ is odd for an interleaver write operation.

11. The method of claim 4, wherein the step of updating the pointer is accomplished by setting the pointer to the result of a $(Ptr+D) \bmod ((N_i+1) \times D)$ operation when $N_i$ is even for an interleaver write operation.

* * * * *